Jan. 16, 1951 W. K. VOLKERS 2,538,487

SELF-FOCUSING, DIRECT-COUPLED, EVEN STAGE AMPLIFIER

Filed Dec. 31, 1946 2 Sheets-Sheet 1

INVENTOR.
Walter K. Volkers
BY Ralph B. Stewart
Attorney

SELF-FOCUSING, DIRECT-COUPLED, EVEN STAGE AMPLIFIER

Filed Dec. 31, 1946 2 Sheets-Sheet 2

INVENTOR.
Walter K. Volkers
BY Ralph B. Stewart
Attorney

Patented Jan. 16, 1951

2,538,487

UNITED STATES PATENT OFFICE 2,538,487

SELF-FOCUSING, DIRECT-COUPLED, EVEN STAGE AMPLIFIER

Walter K. Volkers, Schenectady, N. Y., assignor to Volkers & Schaffer, Inc., a corporation of New York Application December 31, 1946, Serial No. 719,605

6 Claims. (Cl. 179—171)

The present invention concerns an exceptionally simple self-focusing circuit for direct coupled even-stage amplifiers, particularly two-stage amplifiers. Until its discovery direct coupled amplifiers for audio frequencies and other purposes were invariably more complicated and expensive in their design than the standard R/C type amplifier, and their use was therefore restricted to laboratory work and similar special purposes.

The main object of the present invention is to make available to the radio industry a self-focusing direct-coupled amplifier which requires less parts and is more economic in production than R/C coupled amplifiers, thus helping to reduce the manufacturing costs of domestic radios and similar equipment.

Another object of my invention is to provide an improved self-focusing circuit for direct-coupled amplifiers which possesses better hum and voltage-fluctuation-compensation properties than earlier designs in this field.

A further object of my invention is to avail myself of the peculiar low-screen-voltage/low-screen-current properties of "starved" screen grid tubes for the purpose of eliminating screen filtering equipment. This starved operation is fully described in my co-pending patent application Serial No. 701,989, filed October 8, 1946, "High-gain-low-drain operation of screen-grid tubes."

Finally, an object of my invention is to provide an unusually simple direct-coupled two-stage amplifier which has a noticeably higher overall-gain than conventional R/C coupled amplifiers.

Figures 1, 2, 3, 4:
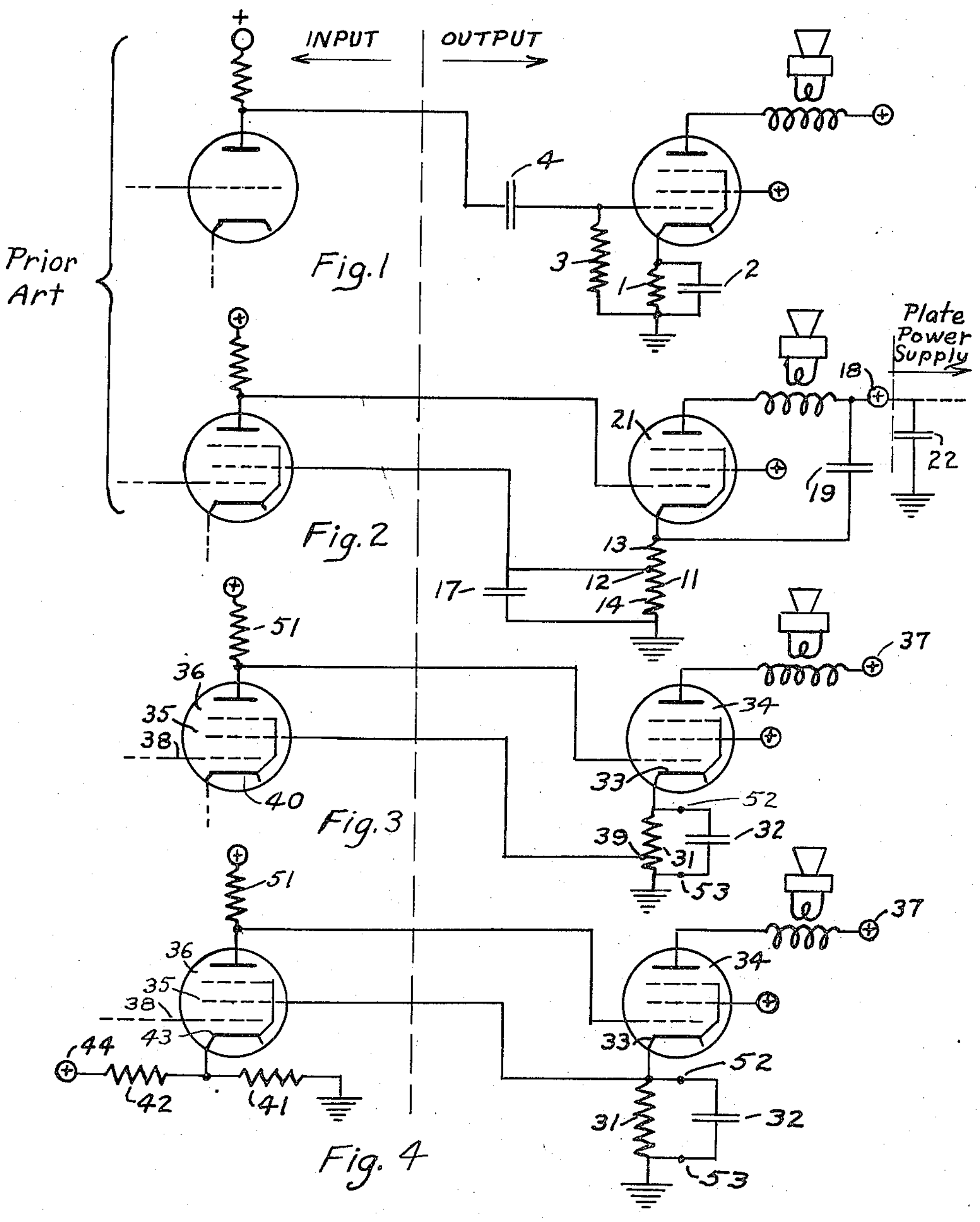

My invention will be better understood by referring to the accompanying drawing in which:

Figure 1 shows a standard R/C coupled amplifier having two condensers and two resistors in its output stage, Figure 2 the nearest prior art to my invention disclosing a self-focusing direct coupled amplifier which also requires two condensers and two resistors in its output stage, Figure 3 a self-focusing direct coupled amplifier according to my invention requiring one tapped resistor and one by-pass condenser only in the output stage, and Figure 4 another form of my invention which has an untapped resistor and one condenser in the output stage but a tapped cathode resistor in the input stage.

Figures 5, 6, 7:
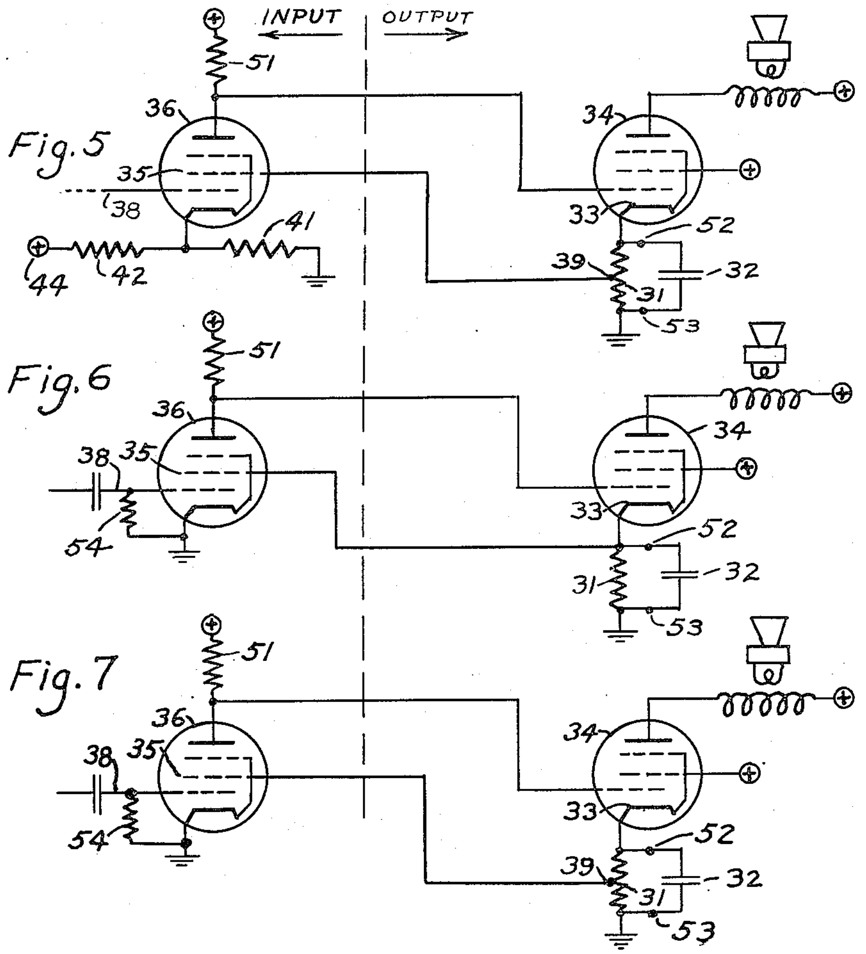

Figure 5 shows a combination of these designs and

Figs. 6 and 7 the application of "loose-grid starvation" as additional means of focusing direct-coupled amplifiers.

The circuits in Figures 1 and 2 clearly reveal the reasons why even the simplest self-focusing direct coupled amplifier known in the art and reproduced in Fig. 2 for comparison purposes has been unable to compete commercially with R/C coupled amplifiers.

The standard non-degenerative R/C coupled amplifier in Figure 1 has in its output stage a cathode resistor 1, by-passed by a condenser 2, also the usual grid-leak 3, as well as a grid coupling condenser 4, the competing direct coupled amplifier in Figure 2 has in its output stage a cathode resistor 11 which is divided by a tap 12 into an upper section 13 and a lower section 14. Tap 12 supplies the "self-focusing" potential to the screen 15 of the input tube 16, i. e. a filtered negative-feedback D. C. potential. The potential of this screen is stabilized against voltage fluctuations by the filter condenser 17 which is connected from the screen 15 to ground. Such stabilization is needed for two reasons:

(a) Since the cathode 20 of the output tube 21 is not by-passed to ground but capacitively coupled to the positive supply terminal 18, the output tube is bound to operate by itself semi-degeneratively for reasons which will be explained below. This means that a portion of the audio signal will appear at tap 12 of the cathode resistor 11 from where it would be fed back degeneratively through both tubes via screen 15 unless condenser 17 stabilizes the potential of the screen. The prior-art-circuit in Figure 2 avails itself of this means of stabilization and, in addition, stabilizes to some extent the potential of cathode 20 of the output tube 21 through the by-pass condenser 19 between the cathode and the positive supply terminal 18.

This stabilization can be only partial, since, in order to obtain a really effective or full stabilization of the cathode potential by-pass condenser 19 and in addition the output power supply filter-condenser 22 (which are both connected in series as far as the by-passing of cathode 20 to ground is concerned) would have to be so large that their series-capacity replaces a cathode-to-ground by-pass-condenser of equivalent suitable size. The latter would be required to be substantially larger than conventional cathode by-pass-condensers, since the cathode resistor 11 is bound to be larger than ordinary output tube cathode resistors because as a result of the direct-coupling between the tubes, it has to match both the output tube's bias and, in addition, the input tube's plate voltage. A 50L6 output tube, for instance, would normally require a biasing cathode resistor of approximately 125 ohms. When direct-coupled to a 12SJ7 or any other voltage amplifier this would, however, have to be raised to, for instance, 500 ohms. Accordingly, with due consideration of frequency response and permissible degeneration the output cathode 20 would have to be by-passed to ground by at least 50, preferably 100 microfarads.

Unfortunately, it does not suffice to make condenser 19 in Figure 2 50 or 100 microfarads since this condenser alone does not by-pass the cathode to ground. It will be necessary, instead, to make in addition, condenser 19 100 microfarads, preferably 200 microfarads, and condenser 22 of the plate supply also 100 microfarads, preferably 200 microfarads, in order to obtain the necessary cathode to ground by-passing capacity of 50–100 mf. This means a very substantial increase of manufacturing costs since condenser 22 would have to be enlarged substantially beyond the customary 8 microfarads (with filter-choke) or 30 to 40 microfarads (with filter-resistor). Furthermore, this large condenser 22 as well as condenser 19 would have to be insulated for the full plate supply voltage which also increases their costs way beyond the costs of the simple low-voltage cathode by-pass condenser 2 of the R/C amplifier in Fig. 1.

(*b*) The other reason why screen-grid 15 must be stabilized against voltage fluctuations by means of condenser 17 is that cathode by-pass condenser 19 in Figure 2 transmits voltage fluctuations of the plate-supply terminal 18 to the cathode. With the cathode resistor 11 acting as a voltage divider these fluctuations would reach the screen 15 and would be amplified by both tubes. If the plate supply is a rectified A. C. source this would mean a transmission and amplification of its hum through the amplifier. Any other kinds of voltage fluctuations would exert a similar disturbing influence.

The circuit in Figure 3 is, according to my invention, free from these drawbacks. The output tube's cathode resistor 31 is by-passed by a low-voltage medium-size condenser 32, similar in rating to condenser 2 of the R/C amplifier in Figure 2. This condenser acts simultaneously as a stabilizer for the potential of cathode 33 of output tube 34 and the screen 35 of the input tube 36. There is no transmission of plate-supply hum to screen 35 present through a condenser. The only manner in which the plate-supply hum can reach the screen of the input tube is through the output tube's plate-current and the corresponding voltage drop across cathode-resistor 31. The hum-compensating theory in my co-pending patent application Serial No. 701,997 filed October 8, 1946, however, clearly discloses that whatever hum appears in cathode 33 of output tube 34 in Figure 3 will, through its re-entry into the circuit via screen 35 of input tube 36, have a degenerating or self-compensating effect which will improve the amplifier's performance.

Exactly the opposite is, however, the case as far as hum re-amplification in the earlier self-focusing circuit in Figure 2 is concerned. Here the low-impedance-connection between the plate-supply 18 and cathode 13, represented by the large condenser 19, causes heavy hum-over-compensation and the consequent hum-increase through amplification via screen 15.

Obviously, my new self-focusing direct-coupled amplifier circuit in Figure 3 therefore not only excels the earlier design in Figure 2 as far as a saving of parts required for its construction and the rating of condensers for either high or low voltages is concerned but, in addition, it also offers an improved performance with regard to hum-compensation and compensation against line voltage fluctuations.

It shall be clearly understood that a condenser similar to the screen condenser 17 in Figure 2 does not appear in my new circuit in Figure 3 for several reasons which are beyond a simple omission of a part at the expense of a minor or major loss of performance or quality. Instead, the screen condenser 17 of Figure 2 is deliberately omitted in Figure 3 as a result of the following physical facts the recognition of which I consider major points of my invention:

(*a*) Since cathode 33 of output tube 34 in Figure 3 is more effectively ground-by-passed than cathode 20 of tube 21 in Figure 2 (the reasons for this improved by-passing having been fully stated above) negative audio-feedback from the output cathode resistor 31 in Figure 3 to the input screen 35 is negligible or can be made so without involving unreasonable manufacturing costs. Additional screen-filtering equipment can therefore be omitted.

(*b*) The positive plate-supply 37 in Figure 3 does not inject directly through a condenser a large ripple or hum component into the output-cathode to input-screen feedback circuit so that no precautions against amplified feedback hum need be taken.

(*c*) The cathode resistor 31 of the output tube is a comparatively husky, low-ohm device which acts as a highly stable voltage divider with regard to screen 35 of the input tube keeping that screen's potential at certain values regardless of potential variations of the input tube's control grid 38 or changes of the input tube's plate current.

This is particularly true if the output tube is a power tube requiring cathode resistors of only a few hundred ohms or less.

(*d*) By operating the input tube 36 under a "starved" condition, i. e. with a plate-current of less than 1/1000 of the "all-cold-electrodes-to-cathode-discharge-current" screen currents are, according to my co-pending case VPA-9913 Serial No. 701,989, reduced to an almost undetectable fraction of their value in the unstarved condition. It will be understood that the expression "all-cold-electrodes-to-cathode-discharge-current" is the current which would flow from the cathode of the tube to the cold electrodes where all of the cold electrodes are connected together and the tube is connected in a circuit with the normal plate operating voltage applied to the cold electrodes. Accordingly, the cathode resistor 31 of the output tube assumes an even more husky relative magnitude with regard to a stabilization of the input tube's screen potential and potential variations at tap 39 of resistor 31 follow practically exclusively cathode potential variations of the output tube, without being noticeably influenced by screen-current variations of the input tube. This condition, more than all others mentioned, makes it possible to operate the screen 35 of the input tube without screen-filtering equipment.

The cathode 40 of the input tube in Figure 3 may be grounded or connected to a biasing resistor or any other circuit element.

As explained in my co-pending applications 11, 18, 22 and 25 Serial Nos. 697,584, and the abandoned applications, 697,585, 701,991, 697,589 and 701,995, referring to direct-coupled amplifiers operating with elevated output cathode potentials, such amplifiers require means of "focusing," i. e. of adjusting and correlating the various tubes and circuit elements to each other in such manner that the no-signal output current assumes a suitable value, usually near the output tube's "focus" or approximately half its saturation current.

The circuit in Figure 3 may, for instance, be focused by suitable selections or adjustments of the input tube's load-resistor 51, the output tube's cathode-resistor-tap 39, the potential of the input tube's cathode 40 or its control grid 38, etc. A particularly simple method of focusing this amplifier consists in shifting tap 39 of the output tube's cathode resistor until the no-signal output current assumes a suitable value. This deprives, however, the designer of his freedom to select and maintain definite input-screen-voltages. A certain pentode, for instance, was found to produce its optimum gain with 100 volts plate supply voltage when starved with a 9 volt screen. Its gain was found to drop noticeably at 6 volts and at 12 volts. If optimum gains of such tubes are desired this leaves little liberty for screen-focusing the amplifier, unless additional means for focusing it are provided. Figures 4–7 show such means.

In Figure 4 the screen 35, of the input tube is connected to the cathode 33 of the output tube, leaving no possibility of focusing the amplifier from its output end. Focusing is achieved instead by adequate "pre-loading" of cathode resistor 41 of input tube 36 through a pre-loading resistor 42 between the cathode 43 of the input tube and its positive supply terminal 44. This method of pre-loading is described in my copending application Serial No. 697,584 filed September 17, 1946. It might be replaced by a regular voltage divider or any other means of operating the input tube at the proper negative focusing bias.

Another modification of these circuits is shown in Figure 5, which is a combination of the focusing circuits of Figs. 3 and 4. In this case both the tap on output cathode resistor 31 and the pre-loading circuits of the input cathode resistor 41 are variable and the amplifier can be focused through either or both of these circuit elements and, in addition, through the input control grid 38 and the input load-resistor 51, if desired. Such a circuit provides full liberty for operation of the tube at optimum starvation input screen potential without sacrificing focusability or simplicity of design.

Another type of circuit, shown in Figs. 6 and 7, involves "zero-bias-operation" through "loose grids" as means of focusing such amplifiers.

I discovered that pentodes, although, when operated at full, rated screen voltages, draw very small grid-currents only, such grid-currents are considerably increased when the tube is starved. A 6J7 at 150 volts plate-supply and with an 80 volts screen will, for instance, show almost identical grid-plate-current-characteristics with its grid alternatingly connected directly to the controlling potential-source or "loosely" through a 10, 20 or 50 megohm-resistor. The same tube, with a 10 volts screen, will begin to deviate noticeably from its original characteristics if more than 10,000 ohms are inserted in the grid-circuit. With one or two megohms in the grid lead this tube will behave much like a "zero-bias-operated" 6SQ7 triode with a leak of a few megohms.

By properly selecting the magnitude of the grid leaks of starved pentodes an additional liberty of design is being provided which can be used for focusing purposes and free selection of starvation screen focusing potentials.

Figures 6 and 7 show examples of this designing technique.

In Figure 6 the screen 35 of the input tube is again connected directly to the cathode 33 of the output tube and focusing is obtained by properly selecting or, if preferred, adjusting grid-leak resistor 54 of the input tube in such manner that the control grid of that tube develops a suitable negative bias potential through its grid currents.

Figure 7 is a repetition of Figure 6 except that in order to obtain a lower screen voltage the input screen 35 is connected to a tap 39 on the output tube's cathode resistor.

It will be obvious to those skilled in the art that my invention is not confined to such circuits as have been discussed and illustrated. Numerous variations of the principles outlined are possible. Amongst them, for instance, instead of varying the position of the tap 39 to which the input screen is attached, it is also possible to change in all diagrams of the drawing the positions of the upper and lower terminals 52 and 53 of the cathode-by-pass-condenser 32 so that this condenser by-passes only part of the cathode-resistor.

In summarizing my invention, it consists in employing a single negative feedback circuit between the cathode of an output tube and the screen of an input tube of a two-stage amplifier, no additional means of self-focusing being provided. This single feedback circuit should be equipped with a filtering device allowing D. C. potentials to pass, but rejecting the A. C. component of the signal. I prefer using as a filtering device the same cathode by-pass condenser which would be required anyhow for the purpose of preventing degenerative operation of the output tube.

In its preferred form although not necessarily in its only form I operate the input tube in a starved condition. Since such condition usually requires screen potentials in the neighborhood of 5–25 volts and since in a direct coupled circuit the voltage drop across the cathode resistors of power-output-tubes is usually in the neighborhood of 10–50 volts, the cathode resistor of such tubes, whether tapped or untapped, provides an excellent potential source for the screen of a starved input tube. By availing myself of this opportunity a two-stage amplifier could be produced which outperformed the ordinary R/C coupled amplifier with regard to gain, tone quality and production costs as several samples and tests confirmed.

I claim:

1. A self-focusing, direct-coupled vacuum tube amplifier comprising an even number of amplification stages in which the tube of the input stage has a control grid and a screen grid and the tube of the output stage has a cathode and a power supply having negative and positive terminals and a resistor connected between its cathode and its negative power-supply terminal, and a single voltage feedback lead for supplying the entire self-focusing energy from the output stage to the input stage comprising a connection extending from said resistor to the screen grid of said input tube and serving to bias said screen grid by direct current potential drop across at least a portion of said resistor and a condenser connected directly in shunt between the cathode of the output tube and the negative power supply terminal, said cathode being connected to the positive terminal of the power supply solely through the space current path of said output tube whereby the transfer of alternating current from said resistor to said screen grid is prevented.

2. A direct coupled self-focusing amplifier according to claim 1, said lead being connected to the cathode end of said resistor.

3. A direct coupled amplifier according to claim 1, said lead being connected to a tap on said resistor between said cathode of said output tube and said negative power supply terminal.

4. A direct coupled amplifier according to claim 1, said input tube being operated at a plate current less than one-one-thousandth of its all-cold-electrodes-to-cathode-discharge-current measured at a plate-voltage equal to the plate-supply-voltage at which the tube is being operated.

5. A direct coupled amplifier according to claim 1, the cathode of said input tube being connected to a voltage divider between the positive terminal and the negative terminal of a power supply, establishing a suitable biasing potential of such cathode with reference to said input tube's grids, said biasing potential focusing the output current of said input tube towards its desired operating value.

6. A direct coupled amplifier according to claim 1, said input tube being operated at a plate current less than one-one-thousandth of its all-cold-electrodes-to-cathode-discharge-current measured at a plate voltage equal to the supply voltage at which the tube is being operated, the control grid of said input tube being grounded through a leak resistor larger than one hundred thousand ohms which produces a negative bias larger than 0.1 volt.

WALTER K. VOLKERS.

REFERENCES CITED

The following references are of record in the file of this patent:

UNITED STATES PATENTS

| Number | Name | Date |
|---|---|---|
| 2,032,193 | White | Feb. 25, 1936 |
| 2,052,730 | Stoutenburgh | Sept. 1, 1936 |
| 2,088,061 | Hollmann | July 27, 1937 |
| 2,374,248 | Tuttle | Apr. 24, 1945 |
| 2,416,334 | Levy | Feb. 25, 1947 |